(12) United States Patent
Park

(10) Patent No.: US 9,825,075 B2
(45) Date of Patent: Nov. 21, 2017

(54) IMAGE SENSOR AND METHOD FOR FABRICATING THE SAME

(71) Applicant: SK hynix Inc., Gyeonggi-do (KR)

(72) Inventor: Sung-Kun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/236,246

(22) Filed: Aug. 12, 2016

(65) Prior Publication Data
US 2017/0278882 A1 Sep. 28, 2017

(30) Foreign Application Priority Data
Mar. 22, 2016 (KR) .................. 10-2016-0034103

(51) Int. Cl.
H01L 27/146 (2006.01)

(52) U.S. Cl.
CPC .. *H01L 27/14605* (2013.01); *H01L 27/14612* (2013.01); *H01L 27/14616* (2013.01); *H01L 27/14641* (2013.01); *H01L 27/14643* (2013.01); *H01L 27/14689* (2013.01); *H01L 27/14698* (2013.01)

(58) Field of Classification Search
CPC ......... H01L 27/14605; H01L 27/14616; H01L 27/14698; H01L 27/14612; H01L 27/14641; H01L 27/14689; H01L 27/14643
See application file for complete search history.

(56) References Cited

U.S. PATENT DOCUMENTS

2011/0049590 A1* 3/2011 Itonaga ............ H01L 27/14603 257/292

FOREIGN PATENT DOCUMENTS

KR 1020050011947 1/2005

* cited by examiner

*Primary Examiner* — Selim Ahmed
(74) *Attorney, Agent, or Firm* — IP & T Group LLP

(57) ABSTRACT

A method for fabricating an image sensor in accordance with an embodiment of the inventive concepts may include forming first and second photodiodes within a substrate, forming first and second gate electrodes over the substrate, the first gate electrode vertically partially overlapping the first photodiode and the second gate electrode vertically partially overlapping the second photodiode, forming an impurity injection region comprising first and second type impurities between the first and the second gate electrodes, and performing an annealing process to form a floating diffusion region comprising the first type impurities and a channel region comprising the second type impurities. The channel region surrounds lateral surfaces and a bottom surface of the floating diffusion region.

20 Claims, 13 Drawing Sheets

IMAGE SENSOR AND METHOD FOR FABRICATING THE SAME

CROSS-REFERENCE TO RELATED APPLICATION(S)

The present application claims priority under 35 U.S.C. 119(a) to Korean Patent Application No. 10-2016-0034103 filed on Mar. 22, 2016, which is herein incorporated by reference in its entirety.

BACKGROUND

1. Field

Exemplary embodiments of the present invention present invention provide generally image sensors for converting an optical image into an electric signal and methods for fabricating the same.

2. Description of the Related Art

Recently, as the information communication industry is advancing and electronic devices are digitalized, image sensors having improved performance are being used in various fields, such as digital cameras, camcorders, mobile phones, personal communication systems (PCSs), gaming machines, cameras for surveillance, and micro-cameras for medicine.

Generally, an image sensor includes pixel region including a photodiode and a peripheral region. A unit pixel includes the photodiode and a transfer transistor. The transfer transistor is disposed between the photodiode and a floating diffusion region and transfers charges generated by the photodiode to the floating diffusion region.

SUMMARY

Exemplary embodiments of the present invention provide image sensors.

Exemplary embodiments of the present invention provide methods for fabricating image sensors.

The technical objectives of the present invention are not limited to the above mentioned embodiments, and those skilled in the art to which the present invention pertains will understand other technical objectives related to the embodiments can be derived from the following description.

In accordance with an exemplary embodiment of the inventive concepts, a method for forming an image sensor may include forming first and second photodiodes within a substrate, forming first and second gate electrodes over the substrate, the first gate electrode vertically partially overlapping the first photodiode and the second gate electrode vertically partially overlapping the second photodiode, forming an impurity injection region comprising first and second type impurities between the first and the second gate electrodes, and performing an annealing process to form a floating diffusion region comprising the first type impurities and a channel region comprising the second type impurities. The channel region surrounds lateral surfaces and a bottom surface of the floating diffusion region.

The second type impurities have a greater thermal diffusivity than the first impurities.

The second type impurities have a smaller atom size than the first type impurities.

The method may further include injecting an amorphizing material into the substrate prior to the forming of the impurity injection region.

The method may further include injecting a clustering material into the substrate prior to the forming of the impurity injection region.

The method may further include forming gate spacers between sides of the first and the second gate electrodes.

The channel region partially overlaps corners of regions of the first and the second photodiodes.

The impurity injection region may include a reserved floating diffusion region comprising the first type impurities, and a reserved channel region comprising the second type impurities.

The reserved channel region surrounds lateral surfaces and a bottom surface of the reserved floating diffusion region.

The method may further include forming a pixel field region between the first and the second photodiodes, wherein the pixel field region has a lower second type impurity ion concentration than the channel region.

In accordance with an embodiment of the inventive concepts, a method of forming an image sensor may include forming a first photodiode within a substrate, forming a first gate electrode vertically partially overlapping the first photodiode and a second gate electrode spaced apart from the first gate electrode and not vertically overlapping the first photodiode on the substrate, forming a first impurity injection region by injecting n-type impurities and p-type impurities into the substrate between first sides of the first gate electrode and the second gate electrode, and performing an annealing process to form a floating diffusion region and a channel region surrounding the floating diffusion region by diffusing the n-type impurities and the p-type impurities within the first impurity injection region.

The method may further include forming a second photodiode vertically partially overlapping the second gate electrode within the substrate.

The method may further include forming a device voltage node and a reset channel region within the substrate and adjacent to a second side of the second gate electrode.

The forming of the device voltage node and the reset channel region may include forming a second impurity injection region by injecting n-type impurities and p-type impurities into the substrate adjacent to the second side of the second gate electrode, and performing an annealing process to form the device voltage node and the reset channel region surrounding the device voltage node by diffusing the n-type impurities and the p-type impurities within the second impurity injection region.

The device voltage node and the floating diffusion region may have an identical depth, and the reset channel region and the channel region may have an identical depth.

In accordance with an embodiment of the inventive concepts, a method of forming an image sensor may include forming a first photodiode within a substrate, forming a first transistor having a first side vertically partially overlapping the first photodiode on the substrate, forming an impurity injection region by injecting first and second type impurities into the substrate adjacent to a second side of the first transistor, and performing an annealing process to form a floating diffusion region by diffusing the first type impurities within the impurity injection region and a channel region surrounding lateral surfaces and a bottom surface of the floating diffusion region by diffusing the second type impurities within the impurity injection region.

The method may further include forming a second photodiode spaced apart from the first photodiode within the substrate, and forming a second transistor having a first side vertically partially overlapping the second photodiode on the substrate, wherein the impurity injection region is formed between the first photodiode and the second photodiode.

The floating diffusion region may include a first overlap region vertically overlapping the first transistor and a second overlap region vertically overlapping the second transistor, and a length of the first overlap region is identical to a length of the second overlap region.

The channel region may include a first channel region vertically overlapping the first transistor and a second channel region vertically overlapping the second transistor, and a length of the first channel region may be identical to a length of the second channel region.

A portion of the first photodiode overlapping the channel region may be an inverted region.

In accordance with an embodiment of the inventive concepts, an image sensor may include photodiodes suitable for being formed within a substrate, transfer transistors suitable for partially vertically overlapping the photodiodes on the substrate, and a floating diffusion region and a channel region suitable for being formed within the substrate between the transfer transistors. The channel region surrounds lateral surfaces and a bottom surface of the diffusion region.

The channel region may partially overlap corners of the photodiodes.

The floating diffusion region may partially vertically overlap the transfer transistors.

The floating diffusion region may be electrically insulated from the substrate by the channel region.

The channel region may have a higher p-type impurity concentration than the substrate.

In accordance with an embodiment of the inventive concepts, an image sensor may include a first photodiode suitable for being formed within a substrate, a first transistor suitable for being formed within the substrate and partially vertically overlapping the first photodiode, a second transistor suitable for being spaced apart from the first transistor, and a first n-type impurity region suitable for being formed within the substrate between the first transistor and the second transistor and a first p-type impurity region suitable for surrounding lateral surfaces and a bottom surface of the first n-type impurity region.

The first n-type impurity region and the first p-type impurity region may partially vertically overlap the first and the second transistors.

The first p-type impurity region may partially overlap a corner of the first photodiode.

The image sensor may further include a second n-type impurity region suitable for being formed within the substrate adjacent to a second side of the second transistor, and a second p-type impurity region suitable for surrounding lateral surfaces and a bottom surface of the second n-type impurity region.

The first n-type impurity region and the second n-type impurity region may be spaced apart from each other. The first p-type impurity region and the second p-type impurity region may be contiguous.

In accordance with an embodiment of the inventive concepts, an image sensor may include a first photodiode suitable for being formed within a substrate, a first transistor suitable for being formed on the substrate and having a first side vertically overlapping the first photodiode, and a first n-type impurity region suitable for being formed within the substrate and vertically overlapping a second side of the first transistor and a first p-type impurity region suitable for being formed within the substrate and surrounding lateral surfaces and a bottom surface of the first n-type impurity region.

The image sensor may further includes a second photodiode suitable for being formed within the substrate and spaced apart from the first photodiode, and a second transistor suitable for being formed on the substrate and having a first side vertically overlapping the second photodiode. The first n-type impurity region and the first p-type impurity region may partially overlap a second side of the second transistor.

The first n-type impurity region may include a first n-type overlap region vertically overlapping the first transistor and a second n-type overlap region vertically overlapping the second transistor. A length of the first n-type overlap region may be identical with a length of the second n-type overlap region.

The first p-type impurity region may include a first p-type overlap region vertically overlapping the first transistor and a second p-type overlap region vertically overlapping the second transistor. A length of the first p-type overlap region may be identical with a length of the second p-type overlap region.

The image sensor may further include a pixel field region suitable for being formed between the first photodiode and the second photodiode. The pixel field region may have a lower p-type impurity ion concentration than the first p-type impurity region.

The image sensor may further include a second transistor suitable for being formed on the substrate and spaced apart from the first transistor. The first n-type impurity region and the first p-type impurity region may vertically overlap a first side of the second transistor.

The image sensor may further include a second n-type impurity region suitable for vertically overlapping a second side of the second transistor within the substrate, and a second p-type impurity region suitable for surrounding lateral surfaces and a bottom surface of the second n-type impurity region.

A length of a region in which the first n-type impurity region vertically overlaps the first transistor may be identical with a length of a region in which the second n-type impurity region vertically overlaps the second transistor.

The first p-type impurity region and the second p-type impurity region may be contiguous within the substrate under the second transistor.

The first photodiode and the channel region may partially overlap.

The details of other embodiments are included in the detailed description and the drawings.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
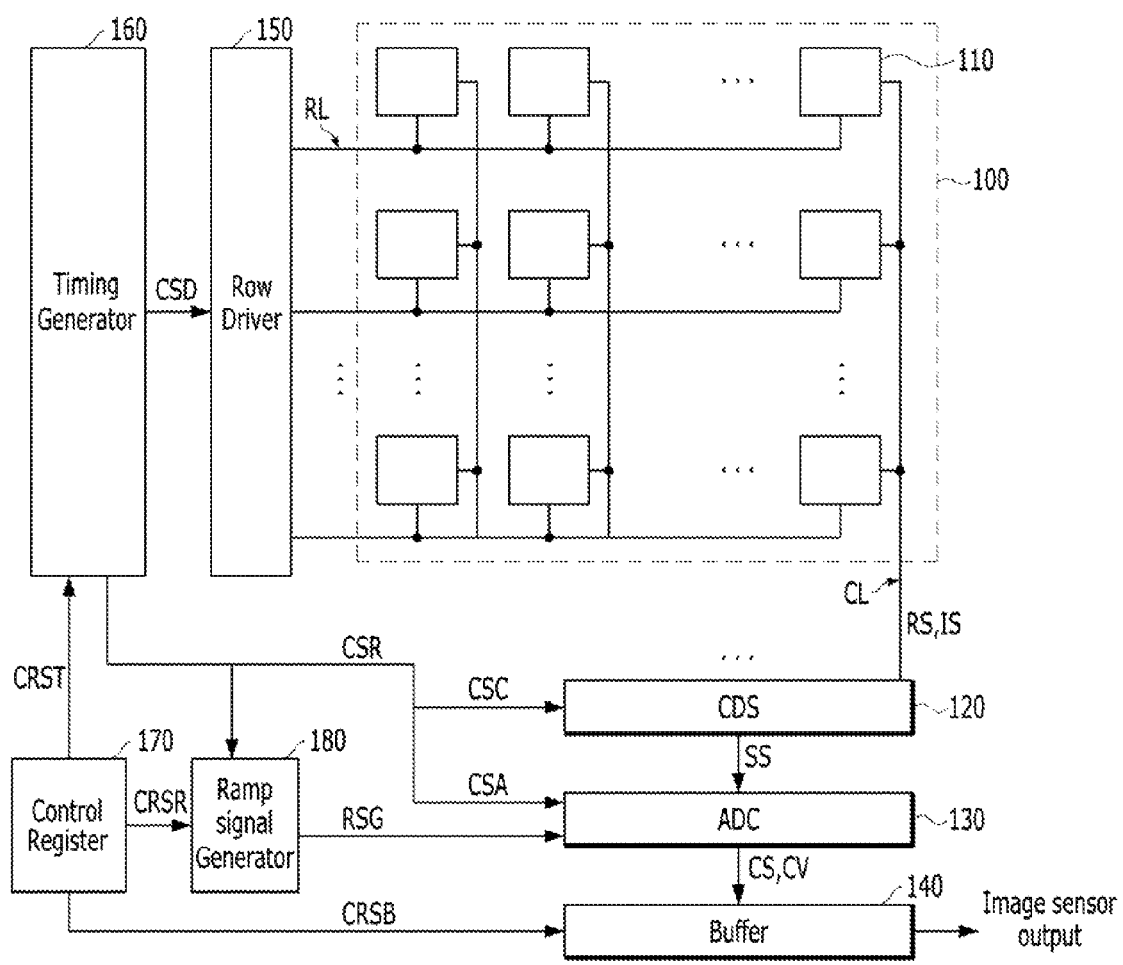
FIG. 1 is a block diagram schematically illustrating an image sensor in accordance with an embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments.

When a first layer is referred to as being "on" a second layer or "on" a substrate, it not only refers to a case in which the first layer is formed directly on the second layer or the substrate but also a case in which a third layer exists between the first layer and the second layer or the substrate.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to, provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature, described in connection with one embodiment may be used singly or in combination with other elements of another embodiment, unless specifically indicated otherwise.

Hereinafter, the various embodiments of the present invention will be described in detail with reference to the attached drawings.

Referring to FIG. 1, an image sensor in accordance with an embodiment of the present invention may include a pixel array 100 configured to have a plurality of unit pixel groups 110 arranged in a matrix for a correlated double sampler (CDS) 120, an analog digital converter (ADC) 130, a buffer 140, a row driver 150, a timing generator 160, a control register 170, and a ramp signal generator 180.

The timing generator 160 may generate one or more control signals CSD, CSC, CSA, and CSR for controlling the operations of the row driver 150, the CDS 120, the ADC 130, and the ramp signal generator 180, respectively. The control register 170 may generate control signals CRSR, CRST, and CRSB for controlling the operations of the ramp signal generator 180, the timing generator 160, and the buffer 140.

The row driver 150 may drive the pixel array 100 in a row line unit. For example, the row driver 150 may generate a selection signal capable of selecting any one of a plurality of row lines RL. Each row line RL may be coupled to a plurality of unit pixel groups 110.

Each of the plurality of unit pixel groups 110 may detect incident light and output an image reset signal RS and an image signal IS to the CDS 120 through a column line CL. The CDS 120 may perform sampling on each received image reset signal RS and each received image signal IS. The plurality of unit pixel groups 110 may be coupled to a plurality of column lines CL, respectively. Furthermore, a plurality of the unit pixel groups 110 in each column of the pixel array 100 may be coupled to one column line CL. The ADC 130 may compare a ramp signal RSG received by the ramp signal generator 180, with a sampling signal SS received by the CDS 120 and output a comparison signal CS to the Buffer. The ADC 130 may count the level transition time of the comparison signal CS in response to a clock signal CSA also referred to as earlier as a control signal, provided by the timing generator 160, and may output a count value CV to the buffer 140. The ramp signal generator 180 may operate under the control of the timing generator 160.

The buffer 140 may store a plurality of digital signals output by the ADC 130 that is, the comparison signals CS and may sense, amplify, and output each of the digital signals. Accordingly, the buffer 140 may include a memory (not shown) and a sense amplifier (not shown). The memory may store the count values. A count value may mean a count value associated with signals output by the plurality of unit pixel groups 110. The sense amplifier may sense and amplify each of the count values output by the memory.

Figure 2A:
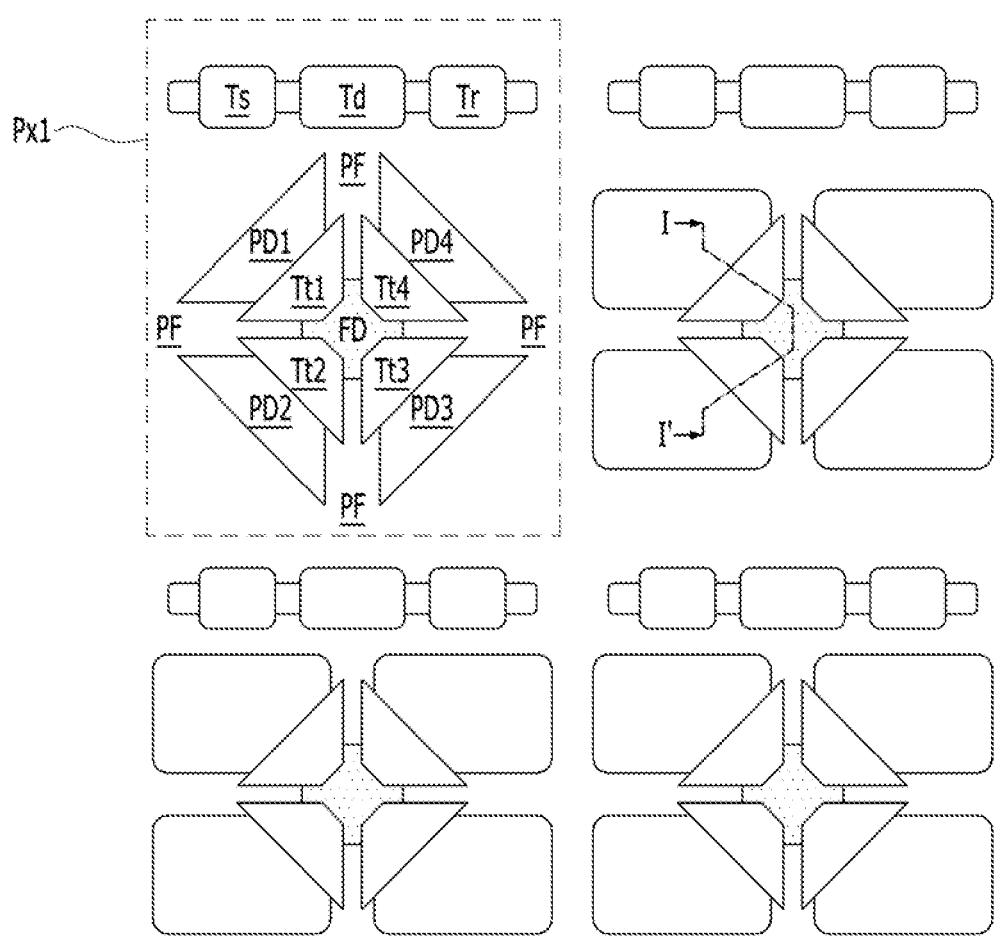
FIGS. 2A to 2C are simplified layout diagrams of pixels of image sensors in accordance with various embodiments of the present invention.
Figure 2B:
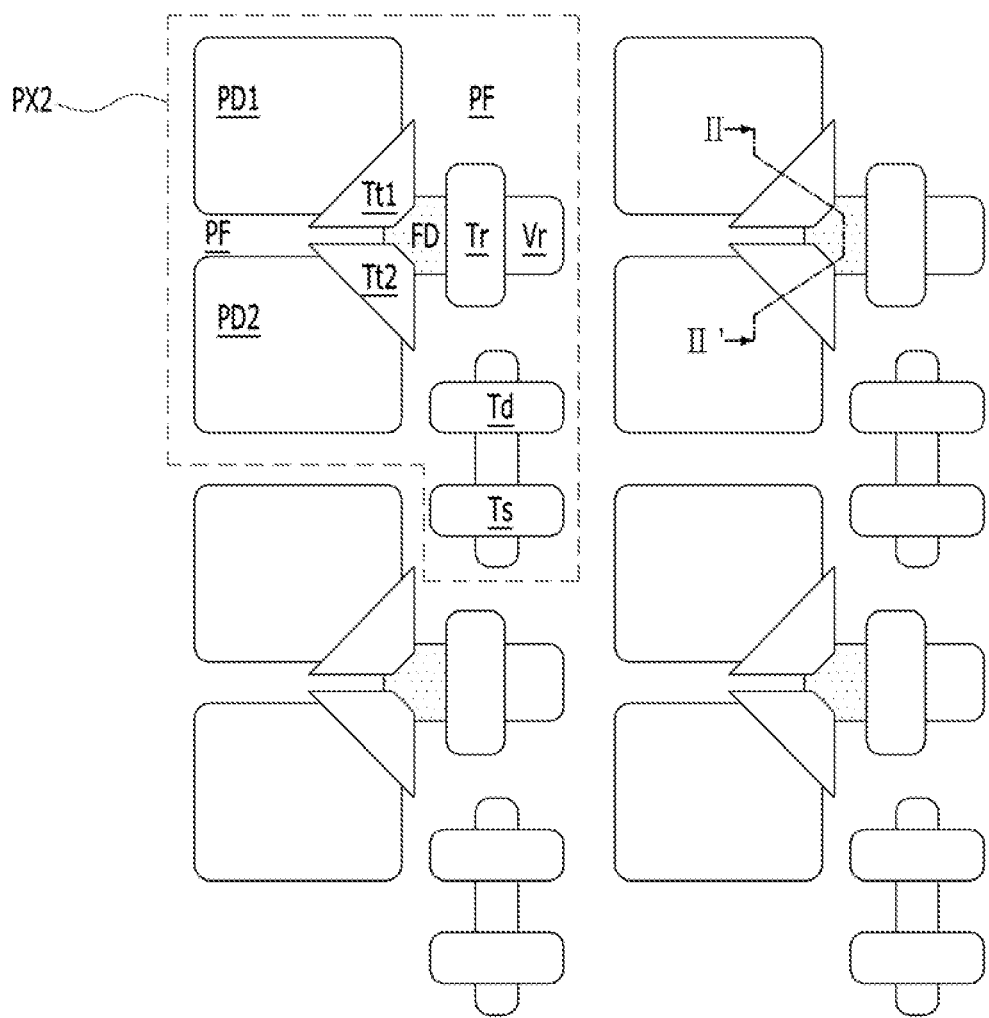
Figure 2C:
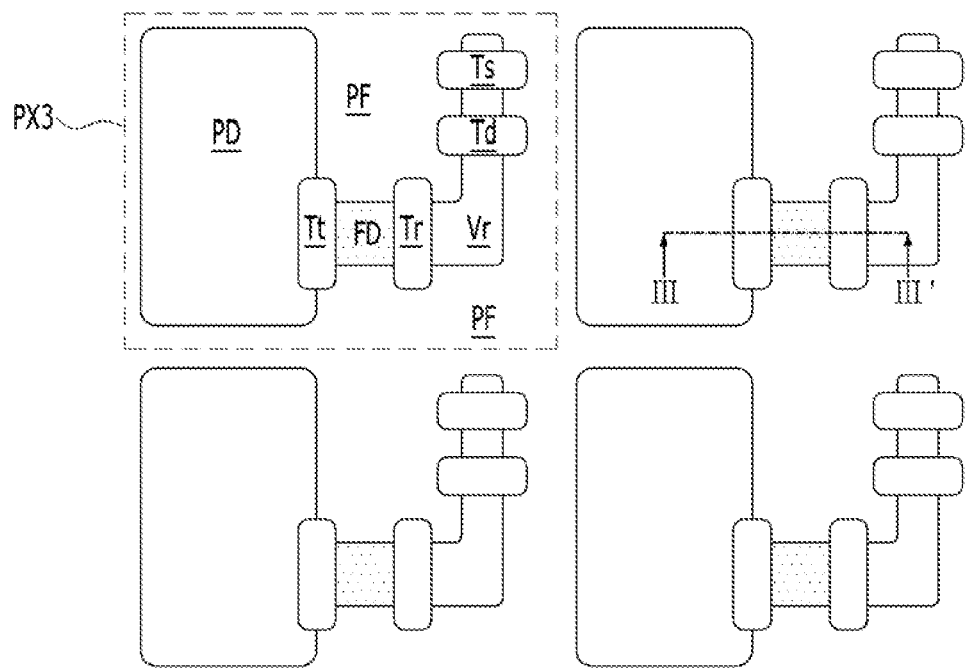

FIGS. 2A to 2C are simplified layout diagrams of pixels of image sensors in accordance with various embodiments of the present invention.

Referring to FIG. 2A, a unit pixel PX1 of an image sensor in accordance with an embodiment of the present invention may include photodiodes PD1-PD4, pixel field regions PF, transfer transistors Tt1-Tt4, a floating diffusion region FD, a reset transistor Tr, a drive transistor Td, and a select transistor Ts. In the unit pixel PX1 in accordance with the embodiment of FIG. 2A, at least four photodiodes PD1-PD4 and at least four transfer transistors Tt1-Tt4 may share a single floating diffusion region FD and may arranged around the floating diffusion region FD to surround the floating diffusion region FD. For example, as illustrated in FIG. 2A, the four photodiodes PD1-PD4 and the four transfer transistors Tt1-Tt4 may be arranged in an axial-symmetrical or a point-symmetrical form, respectively. The four transfer transistors Tt1-Tt4 may be positioned symmetrically around the centrally disposed floating diffusion region FD and the four photodiodes PD1-PD4 ray be positioned around the four transfer transistors Tt1-Tt4.

Each of the photodiodes PD1-PD4 may receive light and generate photoelectrons. The pixel field regions PF may separate the photodiodes PD1-PD4 spatially and/or electrically. In more detail, each pixel field region PF is disposed between two neighboring photodiodes, for example, as illustrated in FIG. 2A, a first pixel field region PF is disposed between photodiodes PD1 and PD2, a second pixel field region PF is disposed between photodiodes PD2 and PD3, a third pixel field region PF is disposed between photodiodes PD3 and PD4, and a fourth pixel field region is disposed between photodiodes PD4 and PD1.

The first pixel field region PF also separates the first transfer transistor Tt1 from the second transfer transistor Tt2, the second pixel field region PF separates the second transfer transistor Tt2 from the third transfer transistor Tt3, the third pixel field region PF separates the third transfer transistor Tt3 from the fourth transfer transistor Tt4, and the fourth pixel field region PF separates the fourth transfer transistor Tt4 from the first transfer transistor Tt1.

Each transfer transistor Tt1-Tt4 may transfer photoelectrons, generated in its respective photodiode PD1-PD4, to the shared floating diffusion region FD in response to respective turn-on signals. In FIG. 2A, the transfer transistors Tt1-Tt4 may be interpreted as gate electrodes.

The floating diffusion region FD may temporarily store the photoelectrons that were generated from the photodiodes PD1-PD4 transferred by the transfer transistors Tt1-Tt4, and may transfer the photoelectrons to the drive transistor Td.

A gate electrode of the drive transistor Td may be electrically connected to the floating diffusion region FD. Accordingly, the drive transistor Td may be driven in response to the amount of electrons in the floating diffusion region FD, and output various voltages and currents.

The select transistor Ts may transfer a device voltage to a source electrode of the drive transistor Td in response to a selection signal. Accordingly, a voltage output to a drain electrode of the drive transistor Td may be changed depending on the amount of photoelectrons of the floating diffusion region FD. The drain electrode of the drive transistor Td may be electrically connected to an output node. The reset transistor Tr may reset the floating diffusion region FD to the same level as the device voltage or a reset voltage, in response to a reset signal.

Referring to FIG. 2B, a unit pixel PX2 of an image sensor in accordance with an embodiment of the present invention may include photodiodes PD1 and PD2, transfer transistors Tt1 and Tt2, pixel field regions PF, a floating diffusion region FD, a reset transistor Tr, a drive transistor Td, and a select transistor Ts. In the unit pixel PX2 two photodiodes PD1 and PD2 and two transfer transistors Tt1 and Tt2 may share a single floating diffusion region FD. The two photodiodes PD1 and PD2 and the two transfer transistors Tt1 and Tt2 may be arranged in an axial-symmetrical form on either side of a first elongated pixel field region PF. In more detail, the first elongated pixel field region PF separates the first photodiode PD1 and the first transfer transistor Tt1 from the second photodiode PD2 and the second transfer transistor Tt2.

The first and second transfer transistors Tt1 and Tt2 may be adjacent to a first side of the floating diffusion region and the corresponding first and second photodiodes PD1 and PD2 may be adjacent to the first and second transfer transistors, respectively.

A first side of the reset transistor Tr may be adjacent to a second side of the floating diffusion region FD. The other side of the reset transistor Tr may be adjacent to a reset voltage node Vr. Thus, when viewed from the top, the first elongated pixel field region PF, the floating diffusion FD, the reset transistor Tr and the reset voltage node Vr are positioned in series in a first direction extending along the elongated axis of symmetry of the first elongated pixel field region PF.

Referring to FIG. 2C, a unit pixel PX3 of an image sensor in accordance with an embodiment of the present invention may include a photodiode PD, pixel field regions PF, a transfer transistor Tt, a floating diffusion region FD, a reset transistor Tr, a drive transistor Td, and a select transistor Ts. One electrode of the reset transistor Tr and one electrode of the drive transistor Td may be electrically coupled to a reset voltage node Vr. The transfer transistor Tt, the floating diffusion region FD, the reset transistor Tr, the drive transistor Td, and the select transistor Ts may be sequentially coupled in this order to form a generally L-shaped region with the reset voltage node Vr coupling the reset transistor Tr with the drive transistor at the right angle transition point of the generally L shaped region. The transfer transistor Tt may be coupled to the photodiode PD. The photodiode PD when viewed from the top has a generally rectangular shape and occupies a first part of the unit pixel PX3 area. Two pixel field regions PF occupy the rest of the unit pixel PX3 area on either side of the L-shaped region.

FIG. 3A to 3D are simplified longitudinal sectional views of the image sensors taken along line I-I' of FIG. 2A or II-II' of FIG. 2B in accordance with various embodiments of the present invention.

Figure 3A:
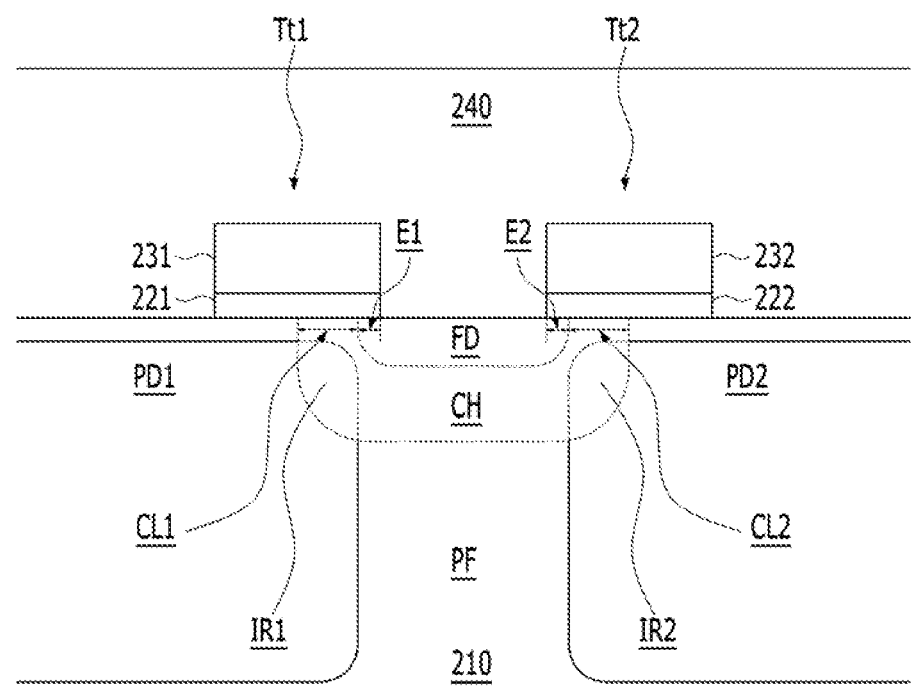
FIGS. 3A to 3D are simplified longitudinal sectional views of the image sensors taken along line I-I' of FIG. 2A or II-II' of FIG. 2B in accordance with various embodiments of the present invention.

Referring to FIG. 3A, an image sensor in accordance with an embodiment of the present invention may include the photodiodes PD1 and PD2 and the pixel field region PF formed within a substrate 210, the transfer transistors Tt1, and Tt2 formed on the substrate 210, and the floating diffusion region FD and a channel region CH formed in the substrate 210 between the transfer transistors Tt1 and Tt2. The image sensor may further include an interlayer dielectric layer 240 configured to cover the transfer transistors Tt1 and Tt2 on the substrate 210.

The substrate 210 may include at least one of a silicon substrate, a silicon on insulator (SOI) substrate, or a substrate having an epitaxial growth layer. For example, in an embodiment of the present invention, the photodiodes PD1 and PD2 may be formed within an epitaxial growth layer. The substrate 210 may include p-type impurities, such as boron (B).

The photodiodes PD1 and PD2 may include n-type impurities, such as phosphorous (P) or arsenic (As). Some regions of the photodiodes PD1 and PD2 overlapping the channel region CH may be inversion regions IR1 and IR2. For example, the inversion regions IR1 and IR2 may be regions inverted from an n-type impurity region to a p-type impurity region.

The pixel field region PF may be formed between the photodiodes PD1 and PD2. The pixel field region PF may be part of the substrate 210 including p-type impurities, such as boron (B), or may include an insulating region, such as a shallow trench isolation (STI) or a deep trench isolation (DTI). In various embodiments of the present invention, the pixel field region PF may include a p-type impurity region formed between the photodiodes PD1 and PD2 and/or an STI or DTI formed between unit pixels PXn. When the pixel field region PF includes a p-type impurity region, the pixel field region PF may have a higher p-type impurity concentration than the substrate 210.

The transfer transistors Tt1 and Tt2 may include gate insulating layers 221 and 222 and gate electrodes 231 and 232, respectively. The gate insulating layers 221 and 222 may include silicon oxide. For example, the gate insulating layers 221 and 222 may include at least one of an oxidized silicon layer which is oxidized from a surface of the substrate 210 or a silicon oxide layer deposited on a surface of the substrate 210. The gate electrodes 231 and 232 may include at least one of doped polysilicon, silicide, metal, a metal compound, or combinations thereof.

The floating diffusion region FD may include n-type impurities. For example, the floating diffusion region FD may include at least one of arsenic (As), phosphorous (P), or antimony (Sb). The floating diffusion region FD may vertically partially overlap the gate insulating layers 221 and 222 and gate electrodes 231 and 232 of the transfer transistors Tt1 and Tt2. The floating diffusion region FD may be extended to portions below the transfer transistors Tt1 and Tt2. For example, the width, length, or area size of a region E1 in which the floating diffusion region FD partially vertically overlaps the first transfer transistor Tt1 and the width, length, or area size of a region E2 in which the floating diffusion region FD partially vertically overlaps the second transfer transistor Tt2 may be the same.

The channel region CH may surround lateral surfaces and a bottom surface of the floating diffusion region FD so that the floating diffusion region FD may be spaced apart from the substrate 210. The channel region CH may include p-type impurities. For example, the channel region CH may include at least one of boron (B) or indium (In). The channel region CH may have a higher p-type impurity ion concentration than the substrate 210 and the pixel field region PF. For example, the channel region CH may have a higher impurity concentration than the photodiodes PD1 and PD2.

The width or lengths CL1 and CL2 of the channel region CH overlapping the transfer transistors Tt1 and Tt2 may be the same.

The transfer transistors Tt1 and Tt2, the floating diffusion region FD, and the channel region CH may have a left and right axial-symmetrical shape along an axis of symmetry extending along the elongated axis of symmetry of the pixel field region PF.

The interlayer dielectric layer 240 may include silicon oxide, such as tetra-ethyl-ortho-silicate (TEOS).

In the image sensor in accordance with an embodiment of the present invention, the leakage current of the floating diffusion region FD can be small due to the channel region CH having a higher p-type impurity ion concentration than the substrate 210 surrounding the floating diffusion region FD. The channel region CH can provide a short channel length since it inverts the polarity of the photodiode PD. Accordingly, the operating speed of the image sensor can be improved.

The transfer transistors Tt1 and Tt2, the floating diffusion region FD, and the channel region CH can have uniform electrical characteristics since they have a left and right line-symmetrical shape. Accordingly, all of pixels can have uniform electrical characteristics, and the distortion of an image of the image sensor can be greatly reduced.

Figure 3B:
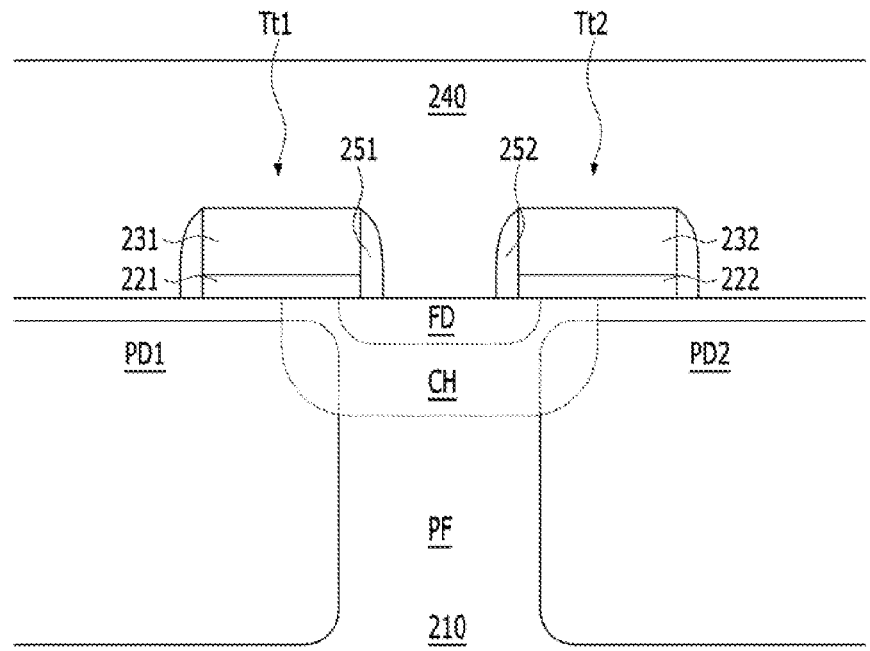

Referring to FIG. 3B, the transfer transistors Tt1 and Tt2 of an image sensor in accordance with an embodiment of the present invention may further include spacers 251 and 252 formed on the sides of the gate insulating layers 221 and 222 and the gate electrodes 231 and 232 compared to the image sensor of FIG. 3A. The spacers 251 and 252 may include, for example, one of silicon nitride, silicon oxide, or a combination thereof.

Figure 3C:
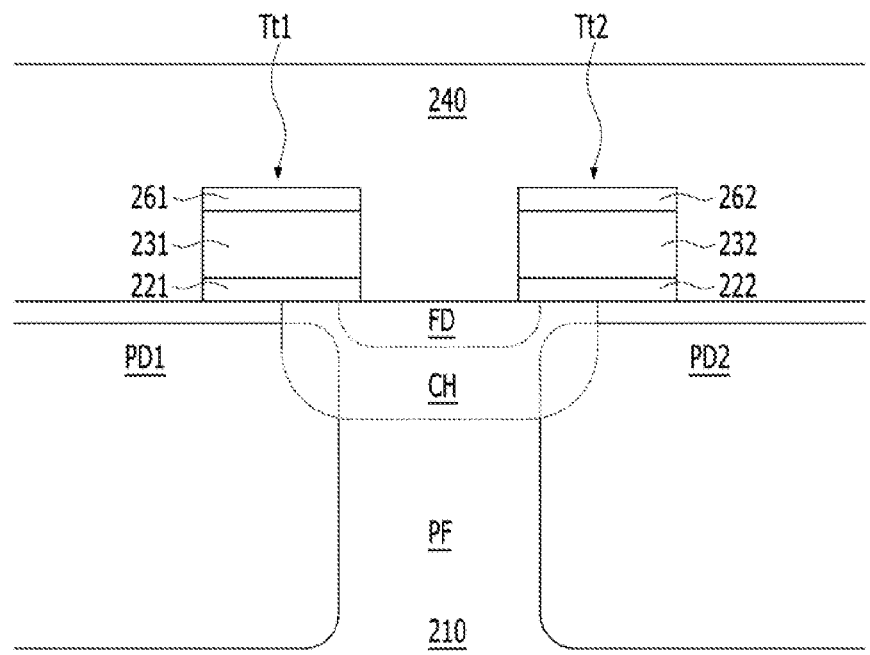

Referring to FIG. 3C, in an image sensor in accordance with an embodiment of the present invention, the transfer transistors Tt1 and Tt2 may further include gate capping layers 261 and 262 formed on the gate electrodes 231 and 232 compared to the image sensors of FIGS. 3A and 3B. The gate capping layers 261 and 262 may include an insulating material such as silicon nitride or silicon oxide. In some embodiments the gate capping layers 261 and 262 may include a conductor, such as metal, metal silicide, or a metal compound.

Figure 3D:
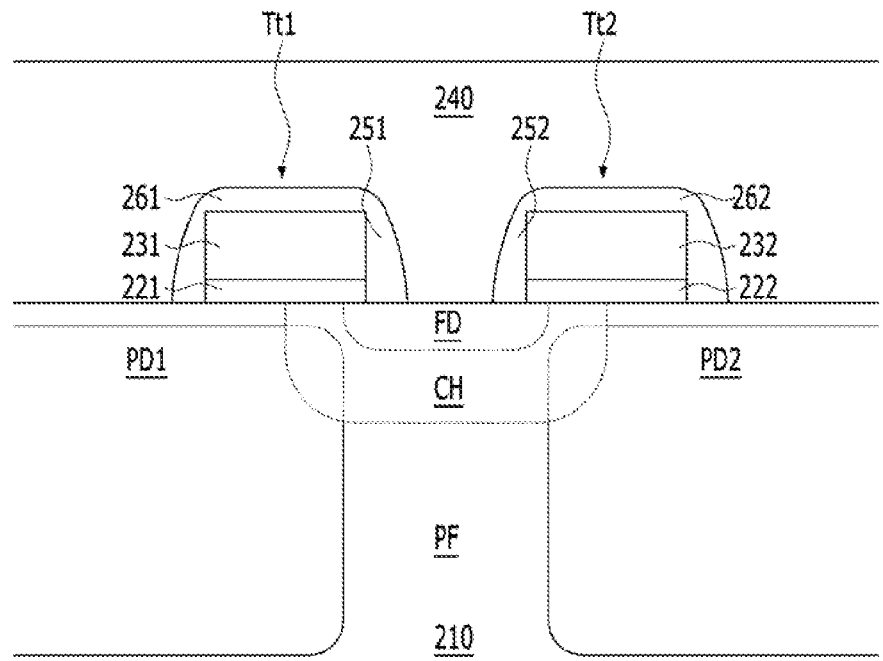

Referring to FIG. 3D, an image sensor in accordance with an embodiment of the present invention may include the spacers 251 and 252 and the gate capping layers 261 and 262 compared to the image sensors of FIGS. 3A to 3C.

Figure 4:
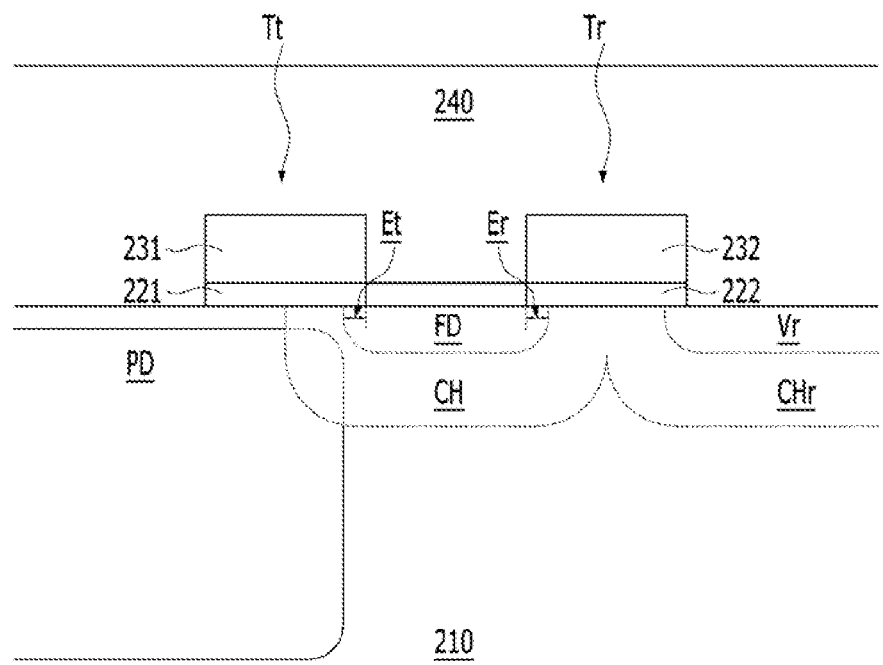
FIG. 4 is a simplified longitudinal sectional view of the image sensor in accordance with an embodiment of the present invention, which is taken along line III-III' of FIG. 2C.

FIG. 4 is a simplified longitudinal sectional view of the image sensor in accordance with an embodiment of the present invention, which is taken along line III-III' of FIG. 2C.

Referring to FIG. 4, the image sensor in accordance with an embodiment of the present invention may include the photodiode PD formed within a substrate 210, the transfer transistor Tt and the reset transistor Tr formed on the substrate 210, the floating diffusion region FD and the channel region CH formed within the substrate 210 between one side of the transfer transistor Tt and one side of the reset transistor Tr, and the reset voltage node Vr and a reset channel region CHr adjacent to the other side of the reset transistor Tr and formed within the substrate 210. The floating diffusion region FD and the reset voltage node Vr may have the same depth and n-type impurities. The channel region CH and the reset channel region CHr may have the same depth and p-type impurities. The floating diffusion region FD and the reset voltage node Vr may be spaced apart from each other. The channel region CH and the reset channel region CHr may be contiguous within the substrate 210 under the reset transistor Tr without a boundary. The width, length and/or area size of a region Et in which the floating diffusion region FD vertically overlaps the transfer transistor Tt and the width, length and/or area size of a region Er in which the floating diffusion region FD vertically overlaps the reset transistor Tr may be the same.

FIGS. 5A to 5D are longitudinal sectional views taken along line I-I' of FIG. 2A or line II-II' of FIG. 2B for describing a method for forming an image sensor in accordance with an embodiment of the present invention.

Figure 5A:
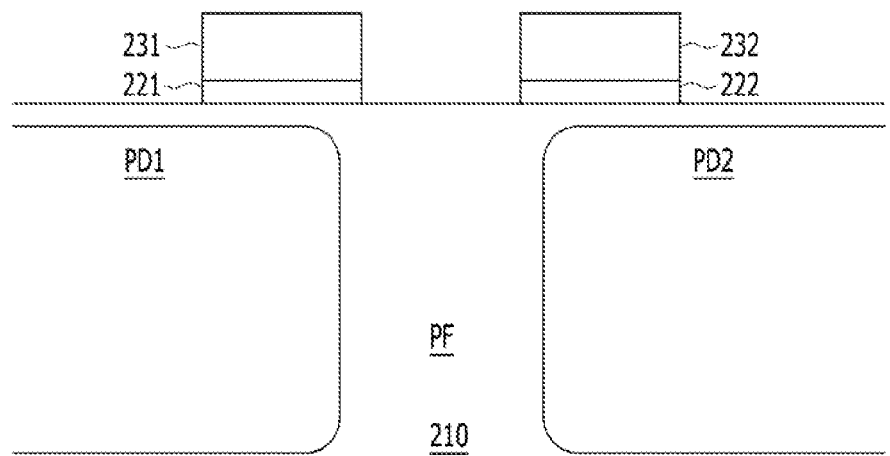
FIGS. 5A to 5D are longitudinal sectional views taken along line I-I' of FIG. 2A or line II-II' of FIG. 2B for describing a method for forming an image sensor in accordance with an embodiment of the present invention.

Referring to FIG. 5A, the method for forming an image sensor in accordance with an embodiment of the present invention may include forming the photodiodes PD1 and PD2 and the pixel field region PF within the substrate 210 and forming the gate insulating layers 221 and 222 and gate electrodes 231 and 232 of the transfer transistors Tt1 and Tt2 on a surface of the substrate 210.

In an embodiment of the present invention, the substrate 210 may have an epitaxial growth layer. For example, the method may include growing an epitaxial layer on a silicon wafer by performing an epitaxial growth process and forming the photodiodes PD1 and PD2 within the epitaxial growth layer. Forming the photodiodes PD1 and PD2 may include injecting n-type impurities, such as phosphorous (P) or arsenic (As), into the substrate 210 or the epitaxial growth layer. Forming the pixel field region PF may include injecting p-type impurities, such as boron (B), into the substrate 210 or the epitaxial growth layer.

Forming the gate insulating layers 221 and 222 may include oxidizing the surface of the substrate 210 by performing an oxidation process or forming silicon oxide on the substrate 210 by performing a deposition process. Forming the gate electrodes 231 and 232 may include forming one or more of doped polysilicon, silicide, metal, and a metal compound by performing a deposition process.

Figure 5B:
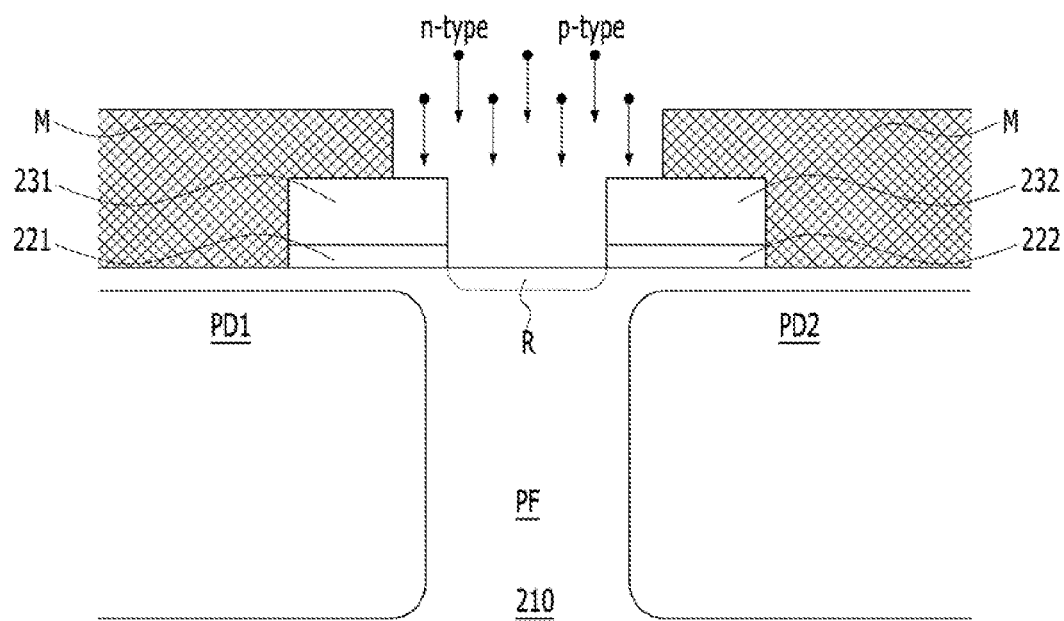

Referring to FIG. 5B, the method may include forming a mask pattern M exposing the region between the photodiodes PD1 and PD2 and forming an impurity injection region R by injecting both n-type impurities and p-type impurities into the substrate 210 using the mask pattern M and the gate electrodes 231 and 232 as an ion implantation mask. In the embodiment of the present invention, the p-type impurities may have a relatively smaller atom size or greater thermal diffusivity than the n-type impurities. For example, the p-type impurities may include boron (B), and the n-type impurities may include arsenic (As). In some embodiments of the present invention, the p-type impurities may include indium (In), and the n-type impurities may include antimony (Sb). The mask pattern M may include a photoresist. After the impurity injection process is performed, the mask pattern M may be removed.

Figure 5C:
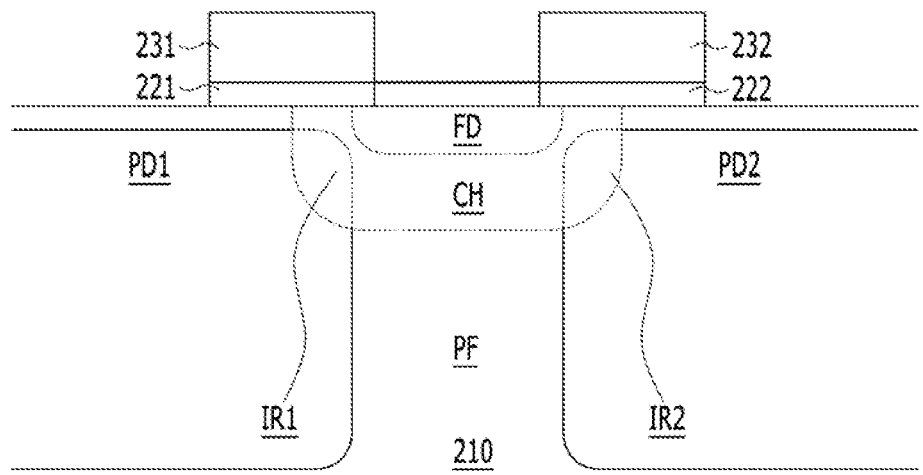

Referring to FIG. 5C, the method may include diffusing the n-type impurities and p-type impurities of the impurity injection region R into the substrate 210 by performing an annealing process. The n-type impurities having a smaller thermal diffusivity, for example, arsenic (As) atoms may be diffused into the substrate 210 relatively shallowly and narrowly, thereby being capable of forming the floating diffusion region FD. The p-type impurities having a greater thermal diffusivity, for example, boron (B) atoms may be diffused into the substrate 210 relatively deeply and widely, thereby being capable of forming the channel region CH. The channel region CH may fully surround the lateral surfaces and bottom surface of the floating diffusion region FD so that the floating diffusion region FD is electrically insulated from the substrate 210. The channel region CH may partially overlap the top corners of the photodiodes PD1 and PD2. The regions of the photodiodes PD1 and PD2 overlapping the channel region CH may be inverted from an n-type conductive layer to a p-type conductive layer.

Thereafter, referring to FIG. 3A, the method may further include forming the interlayer dielectric layer 240 configured to cover the gate insulating layers 221 and 222 and gate electrodes 231 and 232 of the transfer transistors Tt1 and Tt2 on the substrate 210. The interlayer dielectric layer 240 may include silicon oxide.

Figure 5D:
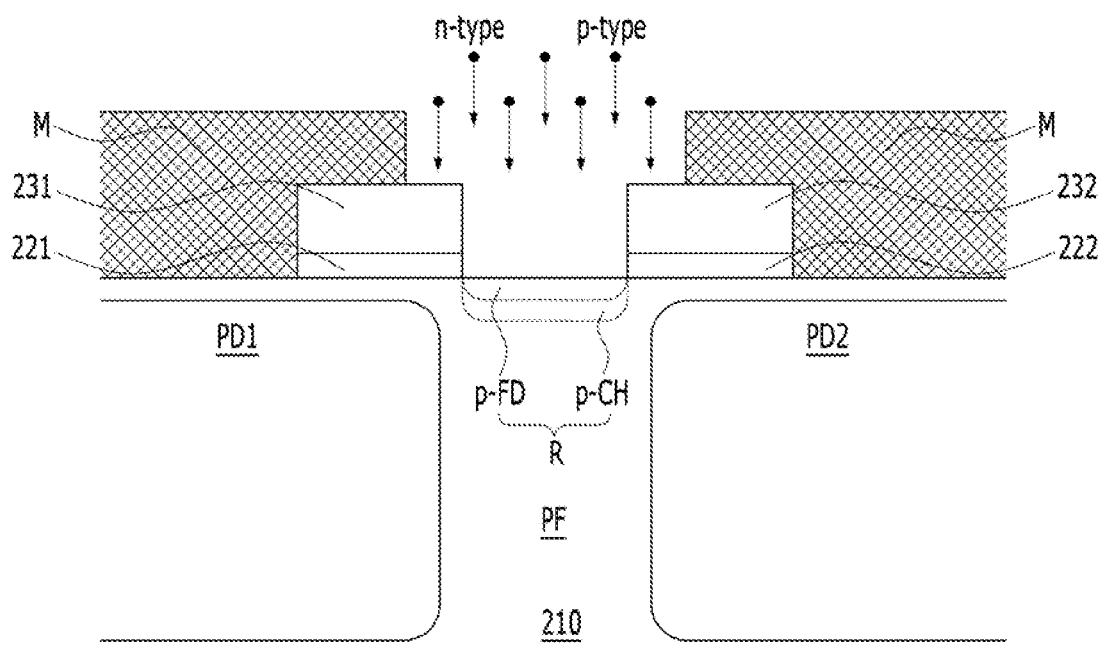

Referring to FIG. 5D, a method for forming an image sensor in accordance with an embodiment of the present invention may include forming the mask pattern M configured to expose the region between the photodiodes PD1 and PD2 and forming the impurity injection region R including a reserved floating diffusion region p-FD and a reserved channel region p-CH by injecting both the n-type impurities and the p-type impurities into the substrate 210 using the mask pattern M and the gate electrodes 231 and 232 as an ion implantation mask, compared to FIG. 5B. For example, the method may include injecting the p-type impurities into the substrate 210 deeper than the n-type impurities. Accordingly, the reserved channel region p-CH including the p-type impurities may be formed under the reserved floating diffusion region p-FD including the n-type impurities. Thereafter, the processes described with reference to FIGS. 5C and 3A may be performed.

FIGS. 6A to 6D are longitudinal sectional views taken along line I-I' of FIG. 2A or line II-II' of FIG. 2B for describing a method for forming an image sensor in accordance with an embodiment of the present invention.

Figure 6A:
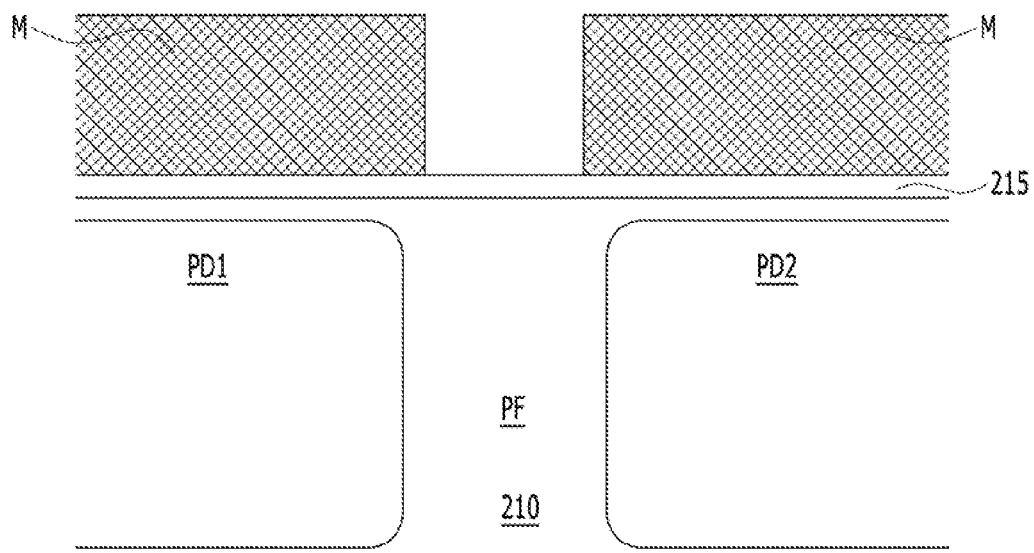
FIGS. 6A to 6D are longitudinal sectional views taken along line I-I' of FIG. 2A or line II-II' of FIG. 2B for describing a method for forming an image sensor in accordance with an embodiment of the present invention.

Referring to FIG. 6A, the method for forming an image sensor in accordance with an embodiment of the present invention may include forming the photodiodes PD1 and PD2 within the substrate 210, forming a buffer layer 215 on the substrate 210, and forming a mask pattern M on the buffer layer 215. The buffer layer 215 may include silicon oxide.

Figure 6B:
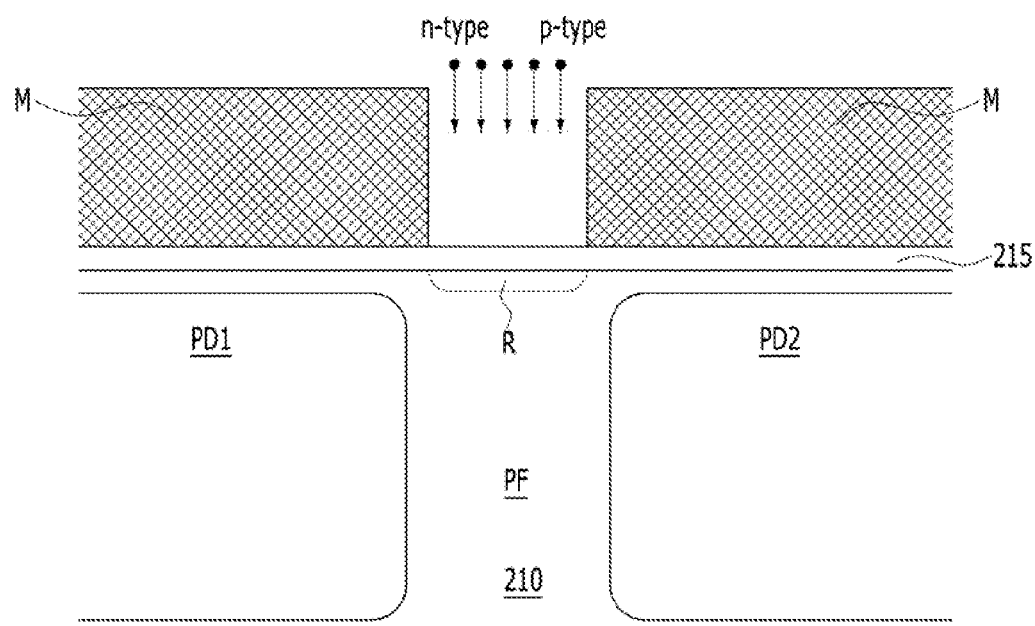

Referring to FIG. 6B, the method may include forming an impurity injection region R by performing an ion implantation process using the mask pattern M as an ion implantation mask and using the buffer layer 215 as an ion implantation buffer layer. The ion implantation process may include injecting both n-type impurities having a relatively larger atom size and smaller thermal diffusivity and p-type impurities having a relatively smaller atom size and greater thermal diffusivity. Thereafter, the mask pattern M may be removed. In another embodiment of the present invention, referring to FIG. 5D, the n-type impurities and the p-type impurities may be injected into the substrate 210 so that they have different depths. For example, referring to FIG. 5D, the impurity injection region R including the reserved floating diffusion region p-FD adjacent to a surface of the substrate 210 and the reserved channel region p-CH under the reserved floating diffusion region p-FD may be formed.

Figure 6C:
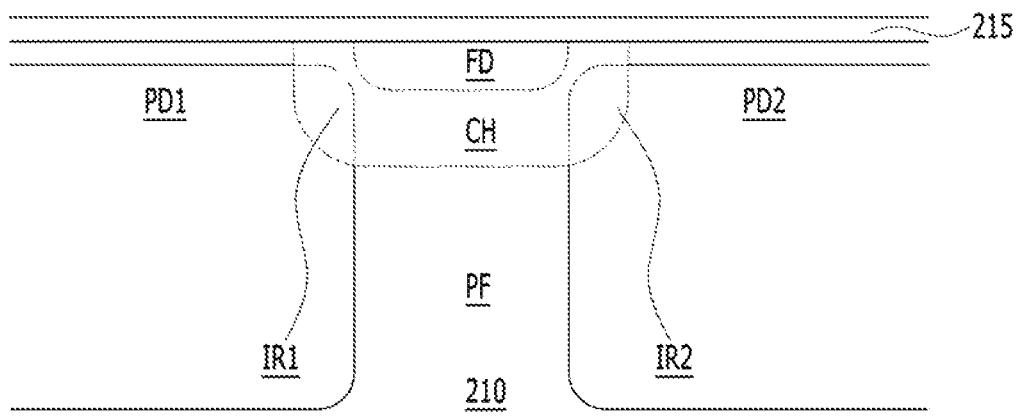

Referring to FIG. 6C, the method may include forming the floating diffusion region FD and the channel region CH by diffusing the n-type impurities and p-type impurities of the reserved floating diffusion region p-FD into the substrate 210 by performing an annealing process. The inversion regions IR1 and IR2 which overlap the channel region CH and the photodiodes PD1 and PD2 may be formed. For example, the polarity such as, n type of the photodiodes PD1 and PD2 may be inverted to the polarity such as, p type of the channel region CH. Thereafter, the buffer layer 215 may be removed. The buffer layer 215 may be removed before the annealing process is performed.

Figure 6D:
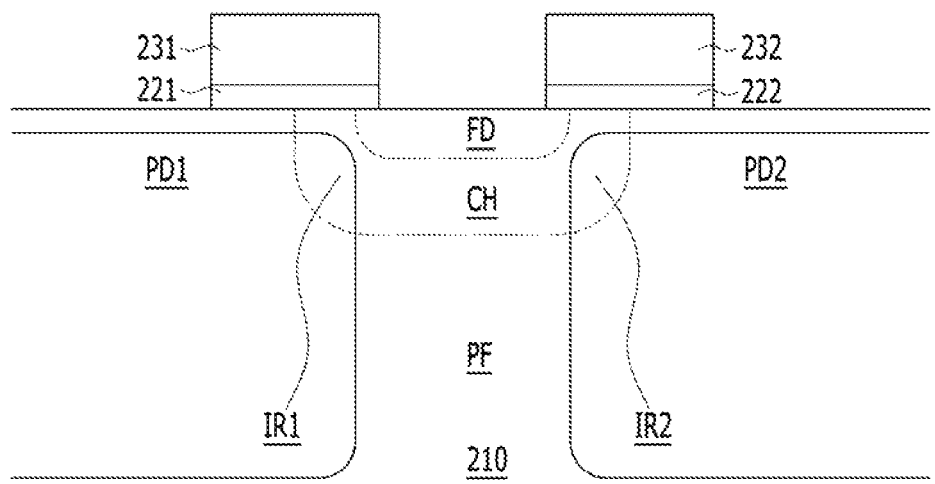

Referring to FIG. 6D, the method may include forming the gate insulating layers 221 and 222 and gate electrodes 231 and 232 of the transfer transistors Tt1 and Tt2 on the substrate 210. The gate insulating layers 221 and 222 and the gate electrodes 231 and 232 vertically partially overlap the photodiodes PD1 and PD2 and the pixel field region PF. For example, the gate insulating layer 221 and the gate electrode 231 are coextensive and extend partially over the photodiode PD1 and the pixel field region PF. Likewise, the gate insulating layer 222 and the gate electrode 232 are coextensive and extend partially over the photodiode PD2 and the pixel field region PF. Thereafter, referring to FIG. 3A, the method may further include forming the interlayer dielectric layer 240 configured to cover the gate insulating layers 221 and 222 and gate electrodes 231 and 232 of the transfer transistors Tt1 and Tt2 on the substrate 210.

Figure 7A:
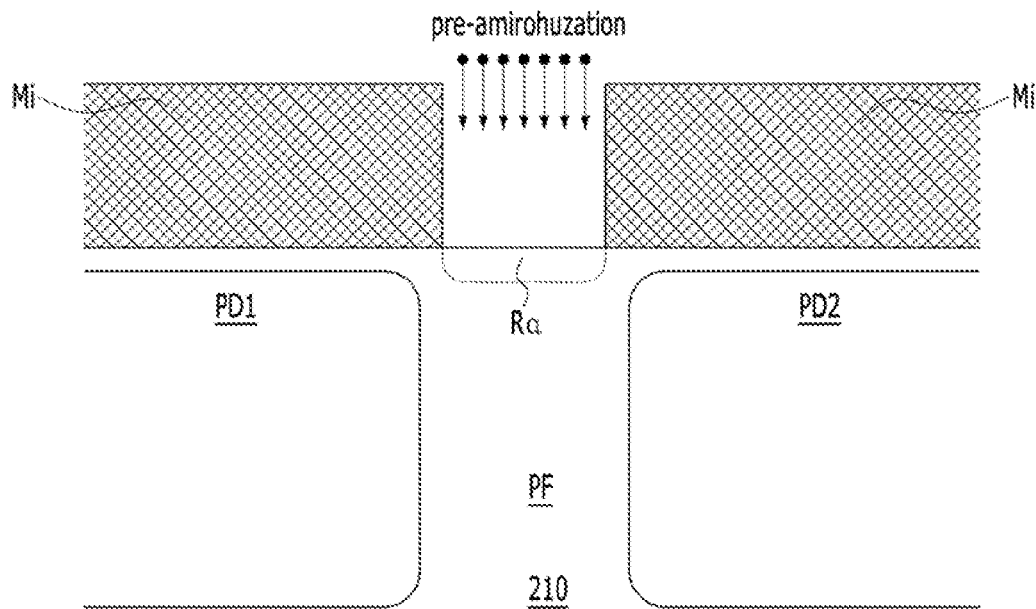
FIGS. 7A and 7B are longitudinal sectional views taken along line I-I' of FIG. 2A or line II-II' of FIG. 2B for describing methods for forming an image sensor in accordance with various embodiments of the present invention.
Figure 7B:
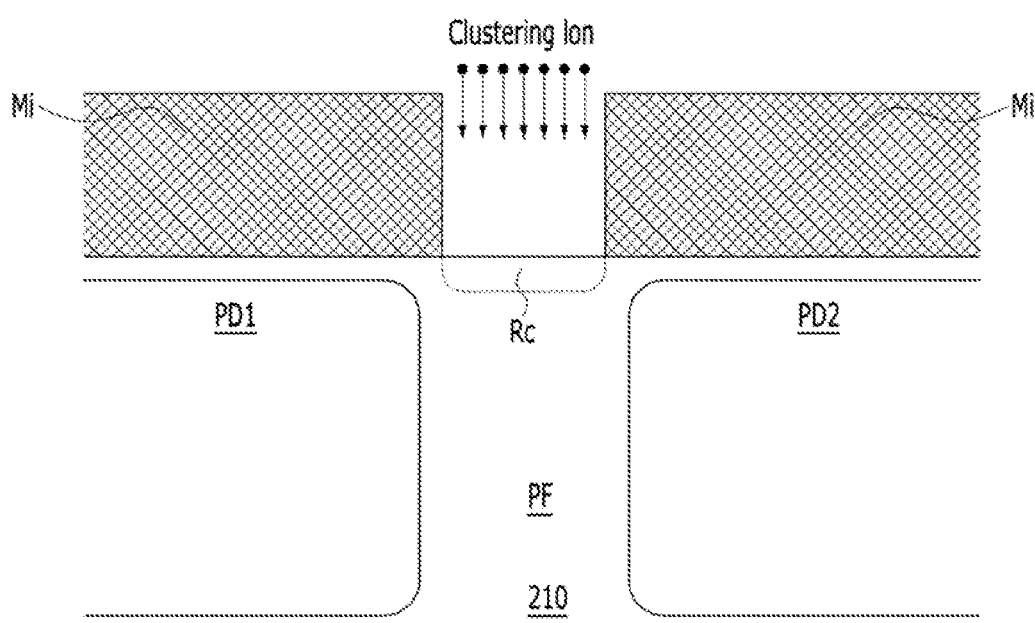

FIGS. 7A and 7B are longitudinal sectional views taken along line I-I' of FIG. 2A or line II-II' of FIG. 2B for describing methods for forming an image sensor in accordance with various embodiments of the present invention.

Referring to FIG. 7A, a method of forming an image sensor in accordance with an embodiment of the present invention may include forming the photodiodes PD1 and PD2 within the substrate 210, forming an ion implantation mask Mi on the substrate 210, and performing a pre-amorphization process of forming an amorphous region Ra within the substrate 210 by implanting ions. The pre-amorphization process may convert the substrate 210 of a single crystal state into a polycrystalline and amorphous state, thereby being capable of increasing a thermal diffusivity of impurities injected into the amorphous region Ra in a subsequent annealing process. That is, the annealing process can be enhanced so that the floating diffusion region FD and the channel region CH are formed deeper and wider. Thereafter, the method may include forming the image sensor of FIG. 3A by performing the processes described with reference to FIGS. 4A to 5C, or FIGS. 6A to 6D.

Referring to FIG. 7B, a method for forming an image sensor in accordance with an embodiment of the present invention may include forming the photodiodes PD1 and PD2 within the substrate 210, forming the ion implantation mask Mi on the substrate 210, and performing an ion implantation process of forming a cluster region Rc within the substrate 210 by implanting clustering ions. Thermal diffusivity of the impurities injected into the cluster region Rc can be increased. The clustering ions may include carbon (C). Thereafter, the method may include forming the image sensor of FIG. 3A by performing the processes described with reference to FIGS. 5A to 5C or 6A to 6D.

Figure 8A:
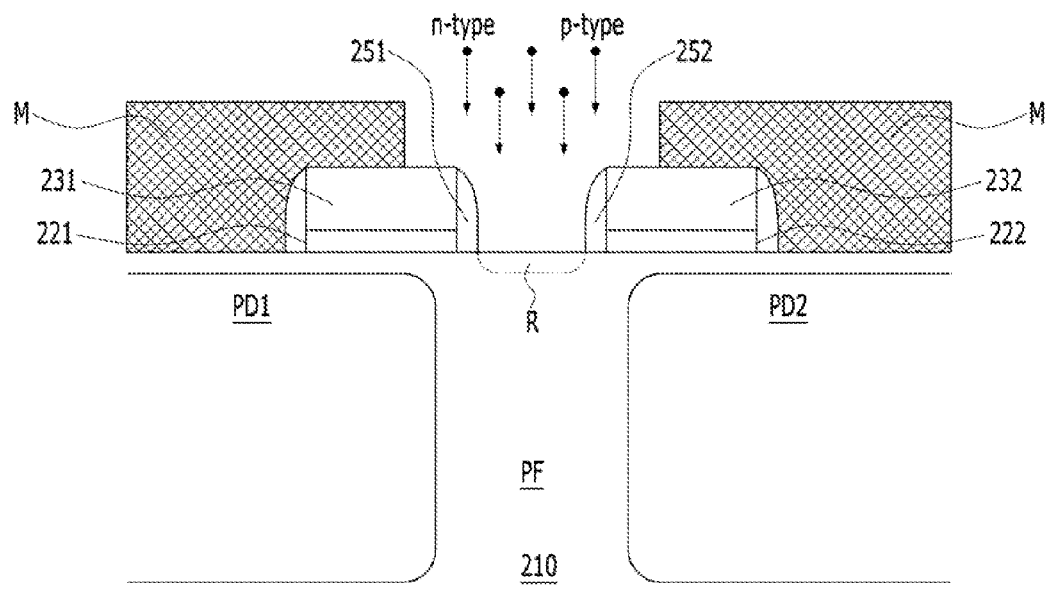
FIG. 8A is a longitudinal sectional view taken along line I-I' of FIG. 2A or line II-II' of FIG. 2B for describing a method for forming an image sensor in accordance with an embodiment of the present invention.
Figure 8B:
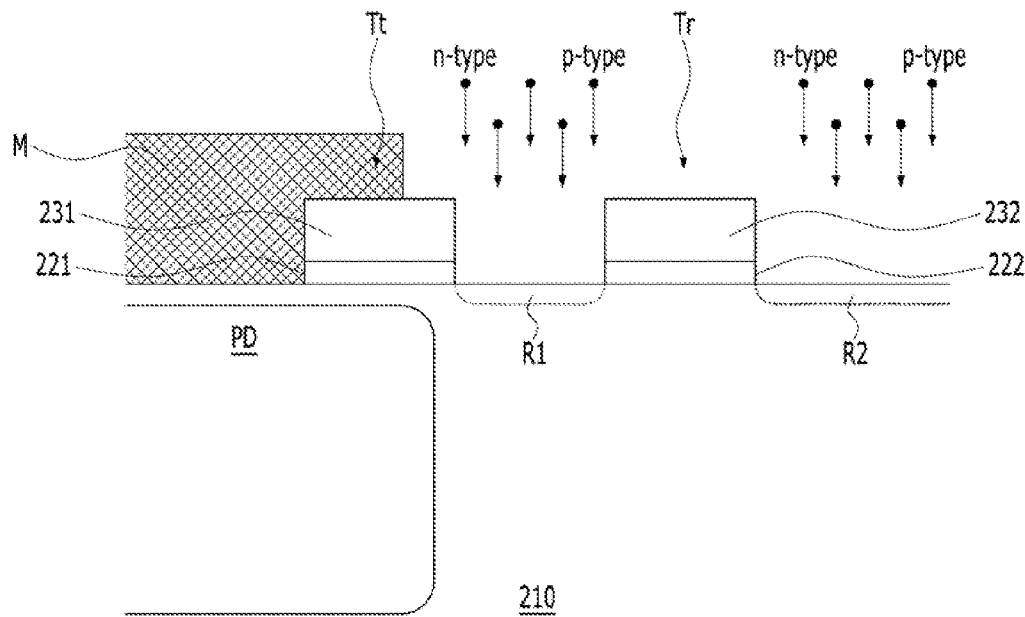
FIGS. 8B and 8C are longitudinal sectional views taken along line III-III' of FIG. 2C for describing methods for forming an image sensor in accordance with embodiments of the present invention.
Figure 8C:
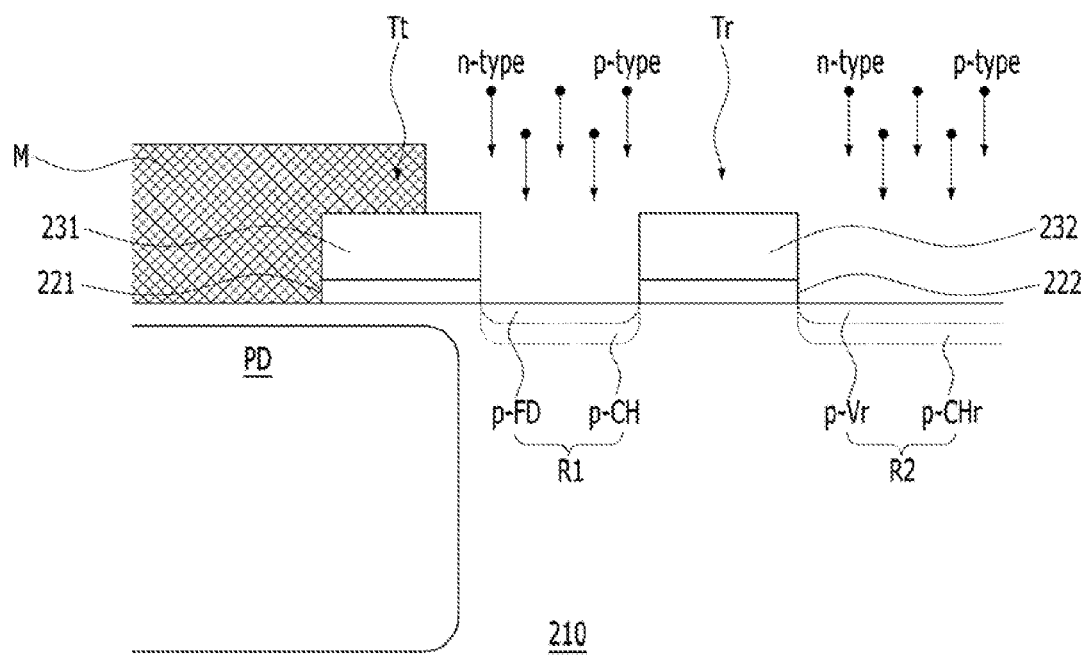

FIG. 8A is a longitudinal sectional view taken along line I-I' of FIG. 2A or line II-II' of FIG. 2B for describing a method for forming an image sensor in accordance with an embodiment of the present invention, and FIGS. 8B and 8C are longitudinal sectional views taken along line III-III' of FIG. 2C for describing methods for forming an image sensor in accordance with embodiments of the present invention.

Referring to FIG. 8A, a method for forming an image sensor may include forming the photodiodes PD1 and PD2 within the substrate 210, forming the gate insulating layers 221 and 222, the gate electrodes 231 and 232, and the spacers 251 and 252 on the substrate 210, forming the mask pattern M, and forming the impurity injection region R by implanting the n-type and p-type impurities into the substrate 210 between the spacers 251 and 252. Thereafter, the method may include removing the mask pattern M and forming the floating diffusion region FD and channel region CH having the shape of FIG. 3B by thermally diffusing the n-type impurities and the p-type impurities within the impurity injection region R by performing an annealing process. In another embodiment of the present invention, referring to FIG. 5B, the impurity injection region R may include the reserved floating diffusion region p-FD and the reserved channel region p-CH under the reserved floating diffusion region p-FD.

Referring to FIG. 8B, a method for forming an image sensor in accordance with an embodiment of the present invention may include forming the photodiode PD within the substrate 210, forming the gate insulating layer 221 and gate electrode 231 of the transfer transistor Tt and the gate insulating layer 223 and gate electrode 233 of the reset transistor Tr on the substrate 210, forming the mask pattern and forming first and second impurity injection regions R1 and R2 by injecting n-type impurities and p-type impurities into the substrate 210. The first impurity injection region R1 may be formed within the substrate 210 between one side of the transfer transistor Tt and one side of the reset transistor Tr. The second impurity injection region R2 may be formed within the substrate 210 adjacent to the other side of the reset transistor Tr. Thereafter, the method may include removing the mask pattern M and forming the floating diffusion region FD, channel region CH, reset voltage node Vr, and reset channel region CHr having the shape of FIG. 4 by thermally diffusing the n-type impurities and the p-type impurities within the first and the second impurity injection regions R1 and R2 by performing an annealing process.

Referring to FIG. 8C, a method for forming an image sensor in accordance with an embodiment of the present invention may include forming a first impurity injection region R1, including a reserved floating diffusion region p-FD and a reserved channel region p-CH under the reserved floating diffusion region p-FD, and a second impurity injection region R2, including a reserved reset voltage node p-Vr and a reserved reset channel region p-CHr under the reserved reset voltage node p-Vr, with reference to FIG. 5D.

Figure 9:
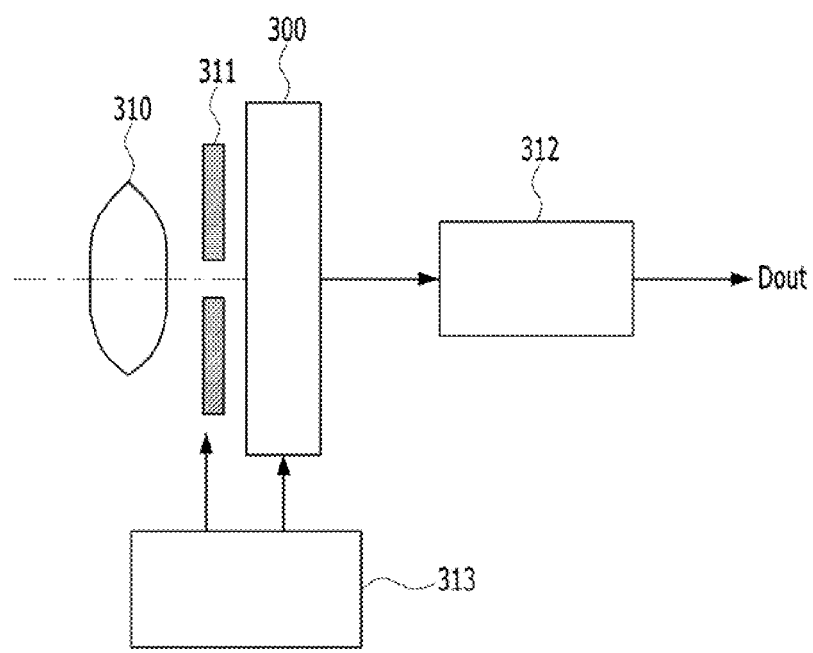
FIG. 9 is diagram schematically showing an electronic device including at least one of the image sensors in accordance with various embodiments of the present invention.

FIG. 9 is diagram schematically illustrating an electronic device including at least one of the image sensors in accordance with the various embodiments of the present invention.

Referring to FIG. 9, the electronic device including at least one of the image sensors, in accordance with the various embodiments of the present invention, may be or include a camera capable of capturing a still image or a moving image. The electronic device may include an optical system 310 or an optical lens, a shutter unit 311, an image sensor 300, a driving unit 313 and a signal processing unit 312 configured to control/drive the shutter unit 311.

The optical system 310 guides image light that is, incident light from a subject to the pixel array (refer to 100 of FIG. 1) of the image sensor 300. The optical system 310 may include a plurality of optical lenses. The shutter unit 311 controls the light radiation period and light shield period of the image sensor 300. The driving unit 313 controls the transmission operation of the image sensor 300 and the shutter operation of the shutter unit 311. The signal processing unit 312 performs various types of signal processing on a signal output by the image sensor 300. An image signal Dout after the signal processing is stored in a storage medium, such as memory, or is output to a monitor.

The image sensors in accordance with various embodiments of the present invention can have an excellent arrangement and a short channel length since they employ channel regions surrounding the floating diffusion regions. Accordingly, the image sensors can have faster operating speed without a malfunction.

The methods for forming an image sensor in accordance with various embodiments of the present invention can include forming the floating diffusion region and the channel region by performing one photolithography process and one annealing process. Accordingly, a process can be simplified, and the floating diffusion region and the channel region having a uniform shape can be formed without misalignment.

In the methods for forming an image sensor in accordance with various embodiments of the present invention, a process can be simplified since the size of the floating diffusion region and the channel region can be set through the annealing process.

A short channel can be implemented since the channel region can invert the photodiode.

Although various embodiments have been described for illustrative purposes, it will be apparent to those skilled in the art that various changes and modifications may be made without departing from the spirit and scope of the invention as defined in the following claims.

What is claimed is:

1. A method for forming an image sensor, comprising:
forming first and second photodiodes within a substrate,
forming first and second gate electrodes over the substrate, the first gate electrode vertically partially overlapping the first photodiode and the second gate electrode vertically partially overlapping the second photodiode,
forming an impurity injection region comprising first and second type impurities between the first and the second gate electrodes, and
performing an annealing process to form a floating diffusion region comprising the first type impurities and a channel region comprising the second type impurities, wherein the channel region surrounds lateral surfaces and a bottom surface of the floating diffusion region.

2. The method of claim 1, wherein the second type impurities have a greater thermal diffusivity than the first impurities.

3. The method of claim 1, wherein the second type impurities have a smaller atom size than the first type impurities.

4. The method of claim 1, further comprising injecting an amorphizing material into the substrate prior to the forming of the impurity injection region.

5. The method of claim 1, further comprising injecting a clustering material into the substrate prior to the forming of the impurity injection region.

6. The method of claim 1, further comprising forming gate spacers between sides of the first and the second gate electrodes.

7. The method of claim 1, wherein the channel region partially overlaps corners of regions of the first and the second photodiodes.

8. The method of claim 1, wherein the impurity injection region comprises:
a reserved floating diffusion region comprising the first type impurities, and
a reserved channel region comprising the second type impurities.

9. The method of claim 8, wherein the reserved channel region surrounds lateral surfaces and a bottom surface of the reserved floating diffusion region.

10. The method of claim 1, further comprising forming a pixel field region between the first and the second photodiodes, wherein the pixel field region has a lower second type impurity ion concentration than the channel region.

11. A method of forming an image sensor, comprising:
forming a first photodiode within a substrate,
forming a first gate electrode vertically partially overlapping the first photodiode and a second gate electrode spaced apart from the first gate electrode and not vertically overlapping the first photodiode on the substrate,
forming a first impurity injection region by injecting n-type impurities and p-type impurities into the substrate between first sides of the first gate electrode and the second gate electrode, and
performing an annealing process to form a floating diffusion region and a channel region surrounding the floating diffusion region by diffusing the n-type impurities and the p-type impurities within the first impurity injection region.

12. The method of claim 11, further comprising forming a second photodiode vertically partially overlapping the second gate electrode within the substrate.

13. The method of claim 11, further comprising forming a device voltage node and a reset channel region within the substrate, and adjacent to a second side of the second gate electrode.

14. The method of claim 13, wherein the forming of the device voltage node and the reset channel region comprises:
forming a second impurity injection region by injecting n-type impurities and p-type impurities into the substrate adjacent to the second side of the second gate electrode, and
performing an annealing process to form the device voltage node and the reset channel region surrounding the device voltage node by diffusing the n-type impurities and the p-type impurities within the second impurity injection region.

15. The method of claim 13, wherein:
the device voltage node and the floating diffusion region have an identical depth, and
the reset channel region and the channel region have an identical depth.

16. A method of forming an image sensor, comprising:
forming a first photodiode within a substrate,
forming a first transistor having a first side vertically partially overlapping the first photodiode on the substrate,
forming an impurity injection region by injecting first and second type impurities into the substrate adjacent to a second side of the first transistor, and
performing an annealing process to form a floating diffusion region by diffusing the first type impurities within the impurity injection region and a channel region surrounding lateral surfaces and a bottom surface of the floating diffusion region by diffusing the second type impurities within the impurity injection region.

17. The method of claim 16, further comprising:
forming a second photodiode spaced apart from the first photodiode within the substrate, and
forming a second transistor having a first side vertically partially overlapping the second photodiode on the substrate,
wherein the impurity injection region is formed between the first photodiode and the second photodiode.

18. The method of claim 17, wherein:
the floating diffusion region comprises a first overlap region vertically overlapping the first transistor and a second overlap region vertically overlapping the second transistor, and a length of the first overlap region is identical to a length of the second overlap region.

19. The method of claim 17, wherein:

the channel region comprises a first channel region vertically overlapping the first transistor and a second channel region vertically overlapping the second transistor, and a length of the first channel region is identical to a length of the second channel region.

20. The method of claim 16, wherein a portion of the first photodiode overlapping the channel region is an inverted region.

* * * * *